(12) United States Patent
Luong et al.

(10) Patent No.: US 10,672,618 B2
(45) Date of Patent: Jun. 2, 2020

(54) SYSTEMS AND METHODS FOR PATTERNING FEATURES IN TANTALUM NITRIDE (TAN) LAYER

(71) Applicants: Tokyo Electron Limited, Tokyo (JP); International Business Machines Corporation, Armonk, NY (US)

(72) Inventors: Vinh Luong, Guilderland, NY (US); Isabel Cristina Chu, Melrose, NY (US); Ashim Dutta, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/032,759

(22) Filed: Jul. 11, 2018

(65) Prior Publication Data

US 2019/0096672 A1 Mar. 28, 2019

Related U.S. Application Data

(60) Provisional application No. 62/563,183, filed on Sep. 26, 2017.

(51) Int. Cl.
*H01L 21/3065* (2006.01)
*H01L 21/033* (2006.01)
*H01L 21/311* (2006.01)
*H01L 21/3213* (2006.01)
*H01J 37/32* (2006.01)

(52) U.S. Cl.
CPC ...... *H01L 21/3065* (2013.01); *H01L 21/0332* (2013.01); *H01L 21/0337* (2013.01); *H01L 21/31116* (2013.01); *H01L 21/31138* (2013.01); *H01L 21/32136* (2013.01); *H01J 37/32449* (2013.01)

(58) Field of Classification Search
None
See application file for complete search history.

(56) References Cited

U.S. PATENT DOCUMENTS

| | | | |
|---|---|---|---|
| 6,531,404 B1 | 3/2003 | Nallan et al. | |
| 2002/0132488 A1* | 9/2002 | Nallan | C23F 4/00 438/720 |
| 2002/0195416 A1* | 12/2002 | Nallan | H01L 21/32136 216/2 |
| 2005/0079703 A1* | 4/2005 | Chen | C23F 3/04 438/633 |

* cited by examiner

*Primary Examiner* — Jiong-Ping Lu
(74) *Attorney, Agent, or Firm* — Wood Herron & Evans LLP

(57) ABSTRACT

Embodiments of systems and methods for patterning features in tantalum nitride (TaN) are described. In an embodiment, a method may include receiving a substrate comprising a TaN layer. The method may also include etching the substrate to expose at least a portion of the TaN layer. Additionally, the method may include performing a passivation process to reduce lateral etching of the TaN layer. The method may further include etching the TaN layer to form a feature therein, wherein the passivation process is controlled to meet one or more target passivation objectives.

16 Claims, 10 Drawing Sheets

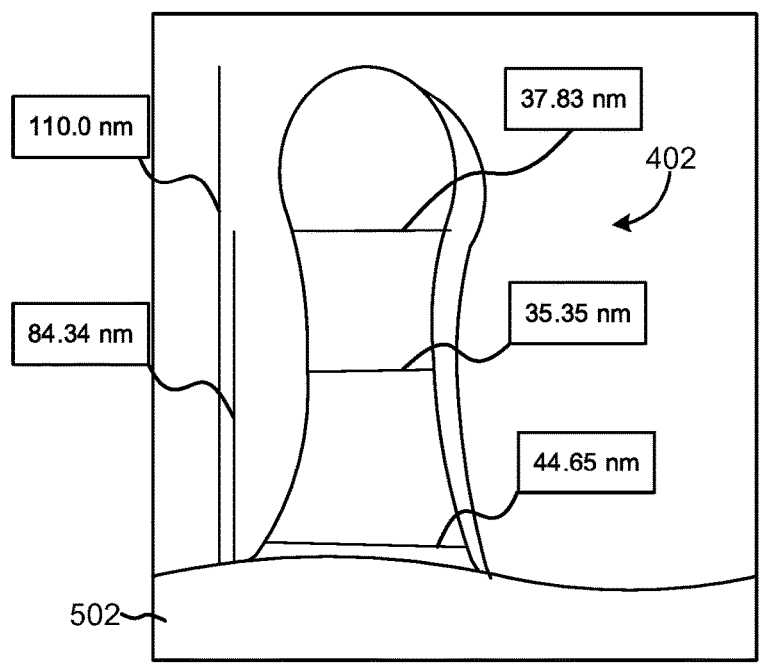
FIG. 6C
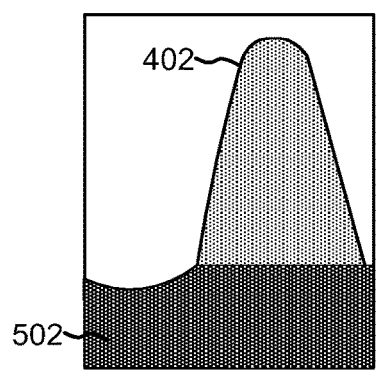 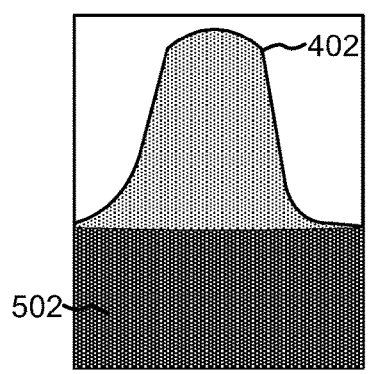 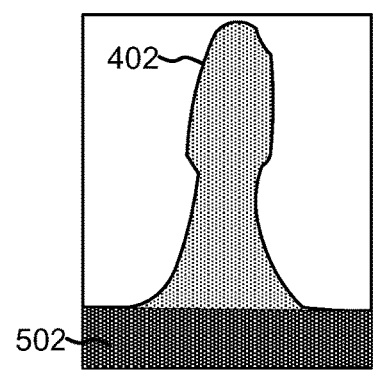
FIG. 6D        FIG. 6E        FIG. 6F

SYSTEMS AND METHODS FOR PATTERNING FEATURES IN TANTALUM NITRIDE (TAN) LAYER

BACKGROUND OF THE INVENTION

Field of Invention

The present invention relates to systems and methods for substrate processing, and more particularly to systems and methods for patterning features in Tantalum Nitride (TaN).

Description of Related Art

The described embodiments relate to plasma processing of TaN used in industry as a hardmask for backend-of-the-line (BEOL) patterning of semiconductor memory and logic devices. The plasma processes include etching multiple films. In some devices, the films may include a silicon containing anti-reflective coating (SiARC) film, a carbon planarizing (OPL) film, a tetraethoxysilane (TEOS) film, and a tantalum nitride (TaN) film. In some systems, the films are etched using a capacitively coupled plasma reactor. Although the operating parameters of the plasma reactor may be varied, depending upon the application and target processing objectives, one such system may operate with a high frequency of 60 MHz RF power at a first electrode and a low frequency of 13.5 MHz RF power at a second electrode.

One problem with etching TaN with an $SF_6$ plasma is the isotropic etching of the sidewall, which can degrade critical dimensions of the created features. In some extreme cases, the created features may be destroyed by catastrophic undercut, or degraded to an extent that any resulting devices are nonfunctional.

SUMMARY

Embodiments of systems and methods for patterning features in tantalum nitride (TaN) are described. In an embodiment, a method may include receiving a substrate comprising a TaN layer. The method may also include etching the substrate to expose at least a portion of the TaN layer. Additionally, the method may include performing a passivation process to reduce lateral etching of the TaN layer. The method may further include etching the TaN layer to form a feature therein, wherein the passivation process is controlled to meet one or more target passivation objectives.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

FIG. 6C is a cross-section diagram illustrating a profile of a feature patterned in a TaN layer according to one embodiment of a method for patterning features in a TaN layer.

FIG. 6D is a cross-section diagram illustrating a profile of a feature patterned in a TaN layer according to one embodiment of a method for patterning features in a TaN layer.

FIG. 6E is a cross-section diagram illustrating a profile of a feature patterned in a TaN layer according to one embodiment of a method for patterning features in a TaN layer.

FIG. 6F is a cross-section diagram illustrating a profile of a feature patterned in a TaN layer according to one embodiment of a method for patterning features in a TaN layer.

DETAILED DESCRIPTION OF EMBODIMENTS OF THE INVENTION

Figure 1:
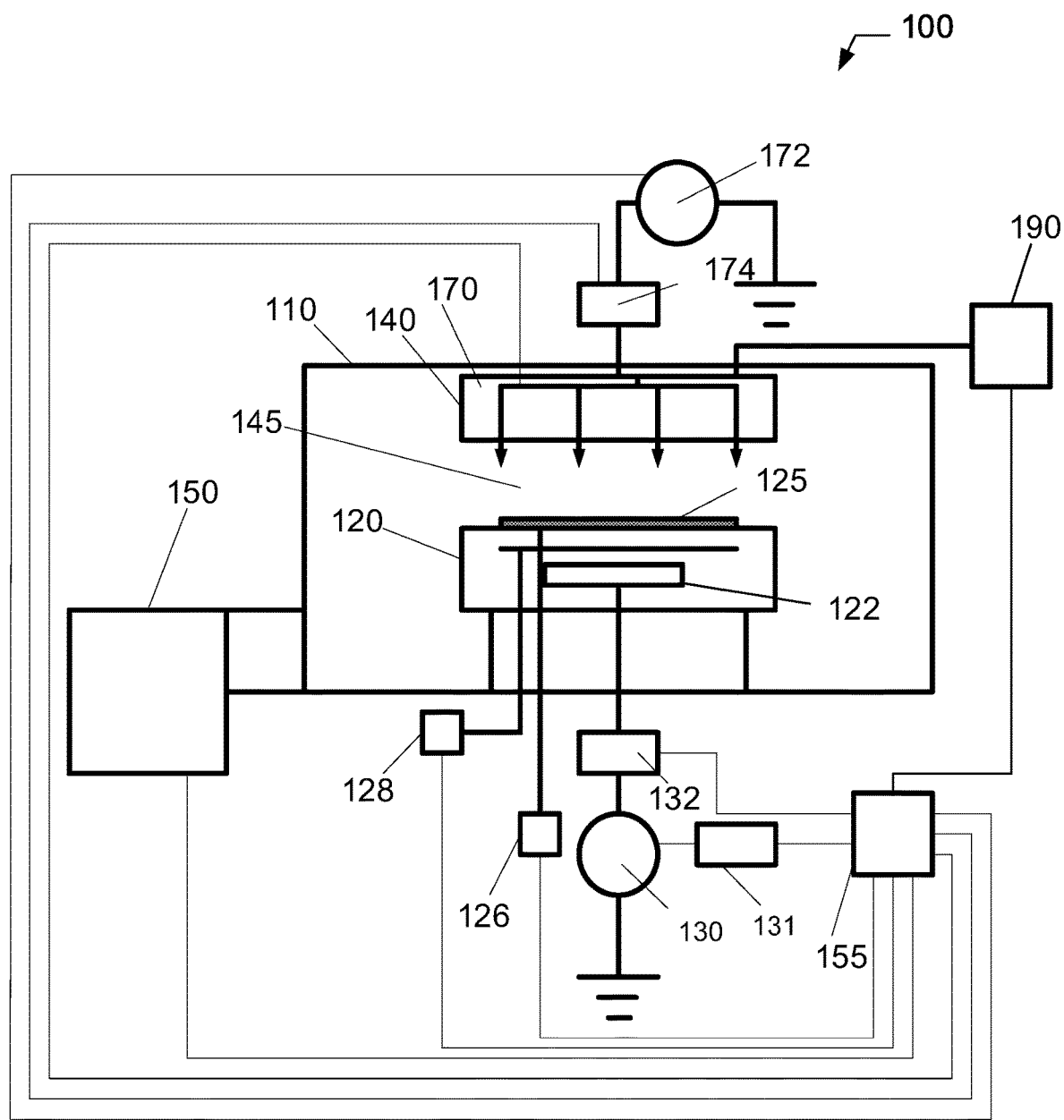
FIG. 1 illustrates one embodiment of a system for patterning features in a TaN layer.

Methods and systems for Patterning TaN are described. In an embodiment, such methods may be used to control formation of a feature in a TaN layer of a multi-layer stack forming a portion of a memory device or similar BEOL patterns. In various embodiments, etch gases may be used to pattern the TaN layer in a plasma reactor chamber, including sulfur hexafluoride ($SF_6$) gas, argon (Ar) gas, boron trichloride ($BCl_3$) gas, and hydrogen bromide (HBr) gas and the like. In an embodiment, the plasma chamber may be a capacitively coupled plasma reactor. Additional processing parameters may be adjusted to control pattern formation in the TaN layer, including temperature, pressure, and exposure time.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

FIG. 1 is an embodiment of a system 100 for patterning TaN. In a further embodiment, the system may be configured to perform patterning of TaN materials as described with reference to FIGS. 2-10. An etch and passivation treatment system 100 configured to perform the above identified process conditions is depicted in FIG. 1 comprising a processing chamber 110, substrate holder 120, upon which a wafer 125 to be processed is affixed, and vacuum pumping system 150. The wafer 125 can be a semiconductor substrate, a wafer, a flat panel display, or a liquid crystal display. Processing chamber 110 can be configured to facilitate etching the processing region 145 in the vicinity of a surface of the wafer 125. An ionizable gas or mixture of process gases is introduced via a gas distribution system 140. For a given flow of process gas, the process pressure is adjusted using the vacuum pumping system 150.

The wafer 125 can be affixed to the substrate holder 120 via a clamping system (not shown), such as a mechanical clamping system or an electrical clamping system (e.g., an electrostatic clamping system). Furthermore, substrate holder 120 can include a heating system (not shown) or a cooling system (not shown) that is configured to adjust and/or control the temperature of substrate holder 120 and the wafer 125. The heating system or cooling system may comprise a re-circulating flow of heat transfer fluid that receives heat from substrate holder 120 and transfers heat to a heat exchanger system (not shown) when cooling, or transfers heat from the heat exchanger system to substrate holder 120 when heating. In other embodiments, heating/cooling elements, such as resistive heating elements, or thermo-electric heaters/coolers can be included in the substrate holder 120, as well as the chamber wall of the processing chamber 110 and any other component within the processing system 100.

Additionally, a heat transfer gas can be delivered to the backside of wafer 125 via a backside gas supply system 126 in order to improve the gas-gap thermal conductance between wafer 125 and substrate holder 120. Such a system can be utilized when temperature control of the wafer 125 is required at elevated or reduced temperatures. For example, the backside gas supply system can comprise a two-zone gas distribution system, wherein the helium gas-gap pressure can be independently varied between the center and the edge of wafer 125.

In the embodiment shown in FIG. 1, substrate holder 120 can comprise an electrode 122 through which RF power is coupled to the processing region 145. For example, substrate holder 120 can be electrically biased at a RF voltage via the transmission of RF power from a RF generator 130 through an optional impedance match network 132 to substrate holder 120. The RF electrical bias can serve to heat electrons to form and maintain plasma. In this configuration, the system 100 can operate as an RIE reactor, wherein the chamber and an upper gas injection electrode serve as ground surfaces.

Furthermore, the electrical bias of electrode 122 at a RF voltage may be pulsed using pulsed bias signal controller 131. The RF power output from the RF generator 130 may be pulsed between an off-state and an on-state, for example. Alternately, RF power is applied to the substrate holder electrode at multiple frequencies. Furthermore, impedance match network 132 can improve the transfer of RF power to plasma in plasma processing chamber 110 by reducing the reflected power. Match network topologies (e.g. L-type, π-type, T-type, etc.) and automatic control methods are well known to those skilled in the art.

Gas distribution system 140 may comprise a showerhead design for introducing a mixture of process gases. Alternatively, gas distribution system 140 may comprise a multi-zone showerhead design for introducing a mixture of process gases, and adjusting the distribution of the mixture of process gases above wafer 125. For example, the multi-zone showerhead design may be configured to adjust the process gas flow or composition to a substantially peripheral region above wafer 125 relative to the amount of process gas flow or composition to a substantially central region above wafer 125. In such an embodiment, gases may be dispensed in a suitable combination to form a highly uniform plasma within the chamber 110.

Vacuum pumping system 150 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 110.

In an embodiment, the source controller 155 can comprise a microprocessor, memory, and a digital I/O port capable of generating control voltages sufficient to communicate and activate inputs to processing system 100 as well as monitor outputs from plasma processing system 100. Moreover, source controller 155 can be coupled to and can exchange information with RF generator 130, pulsed bias signal controller 131, impedance match network 132, the gas distribution system 140, the power supply 190, vacuum pumping system 150, as well as the substrate heating/cooling system (not shown), the backside gas supply system 126, and/or the electrostatic clamping system 128. For example, a program stored in the memory can be utilized to activate the inputs to the aforementioned components of processing system 100 according to a process recipe in order to perform a plasma assisted process, such as a plasma etch process or a post heating treatment process, on wafer 125.

In addition, the processing system 100 can further comprise an upper electrode 170 to which RF power can be coupled from RF generator 172 through optional impedance match network 174. A frequency for the application of RF power to the upper electrode can range from about 0.1 MHz to about 200 MHz, in one embodiment. Alternatively, the present embodiments may be used in connection with Inductively Coupled Plasma (ICP) sources, Capacitive Coupled Plasma (CCP) sources, Radial Line Slot Antenna (RLSA) sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 80 MHz. Moreover, source controller 155 is coupled to RF generator 172 and impedance match network 174 in order to control the application of RF power to upper electrode 170. The design and implementation of an upper electrode is well known to those skilled in the art. The upper electrode 170 and the gas distribution system 140 can be designed within the same chamber assembly, as shown. Alternatively, upper electrode 170 may comprise a multi-zone electrode design for adjusting the RF power distribution coupled to plasma above wafer 125. For example, the upper electrode 170 may be segmented into a center electrode and an edge electrode.

The processing system 100 can further comprise a direct current (DC) power supply 190 coupled to the upper electrode 170 opposing substrate 125. The upper electrode 170 may comprise an electrode plate. The electrode plate may comprise a silicon-containing electrode plate. Moreover, the electrode plate may comprise a doped silicon electrode plate. The DC power supply 190 can include a variable DC power supply. Additionally, the DC power supply 190 can include a bipolar DC power supply. The DC power supply 190 can further include a system configured to perform at least one of monitoring, adjusting, or controlling the polarity, current, voltage, or on/off state of the DC power supply 190. Once plasma is formed, the DC power supply 190 facilitates the formation of a ballistic electron beam. An electrical filter (not shown) may be utilized to de-couple RF power from the DC power supply 190.

For example, the DC voltage applied to upper electrode 170 by DC power supply 190 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 1300 V. Additionally, it is desirable that the DC voltage has a negative polarity. Furthermore, it is desirable that the DC voltage is a negative voltage having an absolute value greater than the self-bias voltage generated on a surface of the upper electrode 170. The surface of the upper electrode 170 facing the substrate holder 120 may be comprised of a silicon-containing material.

The processing system 100 can further comprise a direct current (DC) power supply 190 coupled to the upper electrode 170 opposing substrate 125. The upper electrode 170 may comprise an electrode plate. The electrode plate may comprise a silicon-containing electrode plate. Moreover, the electrode plate may comprise a doped silicon electrode plate. The DC power supply 190 can include a variable DC power supply. Additionally, the DC power supply 190 can include a bipolar DC power supply. The DC power supply 190 can further include a system configured to perform at least one of monitoring, adjusting, or controlling the polarity, current, voltage, or on/off state of the DC power supply 190. Once plasma is formed, the DC power supply 190 facilitates the formation of a ballistic electron beam. An electrical filter (not shown) may be utilized to de-couple RF power from the DC power supply 190.

For example, the DC voltage applied to upper electrode 170 by DC power supply 190 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 1300 V. Additionally, it is desirable that the DC voltage has a negative polarity. Furthermore, it is desirable that the DC voltage is a negative voltage having an absolute value greater than the self-bias voltage generated on a surface of the upper electrode 170. The surface of the upper electrode 170 facing the substrate holder 120 may be comprised of a silicon-containing material.

Depending on the applications, additional devices such as sensors or metrology devices can be coupled to the processing chamber 110 and to the source controller 155 to collect real time data and use such real time data to concurrently control two or more selected integration operating variables in two or more steps involving etch processes, passivation processes, deposition processes, RIE processes, pull processes, profile reformation processes, heating treatment processes, patterning of nitride layer, including a tantalum nitride layer, and/or pattern transfer processes of the integration scheme. Furthermore, the same data can be used to ensure integration targets including completion of post heat treatment, patterning uniformity (uniformity), pulldown of structures (pulldown), slimming of structures (slimming), aspect ratio of structures (aspect ratio), line width roughness, substrate throughput, cost of ownership, and the like are achieved.

By modulating the applied power, typically through variation of the pulse frequency and duty ratio, it is possible to obtain markedly different plasma properties from those produced in continuous wave (CW). Consequently, RF power modulation of the electrodes can provide control over time-averaged ion flux and the ion energy.

Figure 2A:
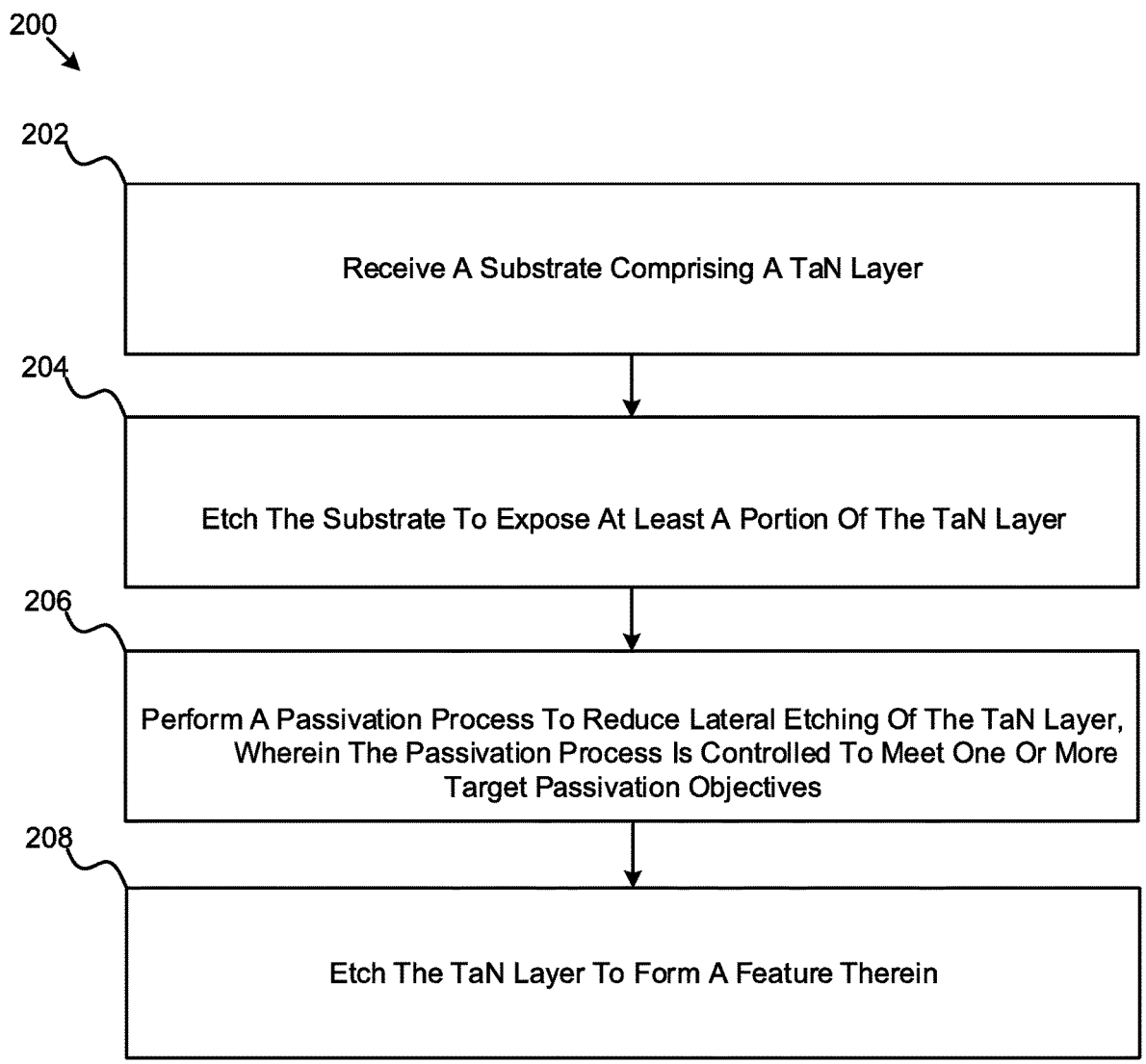
FIG. 2A illustrates one embodiment of a method for patterning features in a TaN layer.

FIG. 2A illustrates an embodiment of a method 200 for patterning features in a TaN layer. In an embodiment, the method 200 includes receiving a substrate comprising a TaN layer as shown at block 202. Additionally, the method 200 may include etching the substrate to expose at least a portion of the TaN layer as shown at block 204. At block 206, the method 200 may include performing a passivation process to reduce lateral etching of the TaN layer. Additionally, an embodiment of the method 200 may include etching the TaN layer to form a feature therein, where the passivation process is controlled to meet one or more target passivation objectives, as shown at block 208.

Figure 2B:
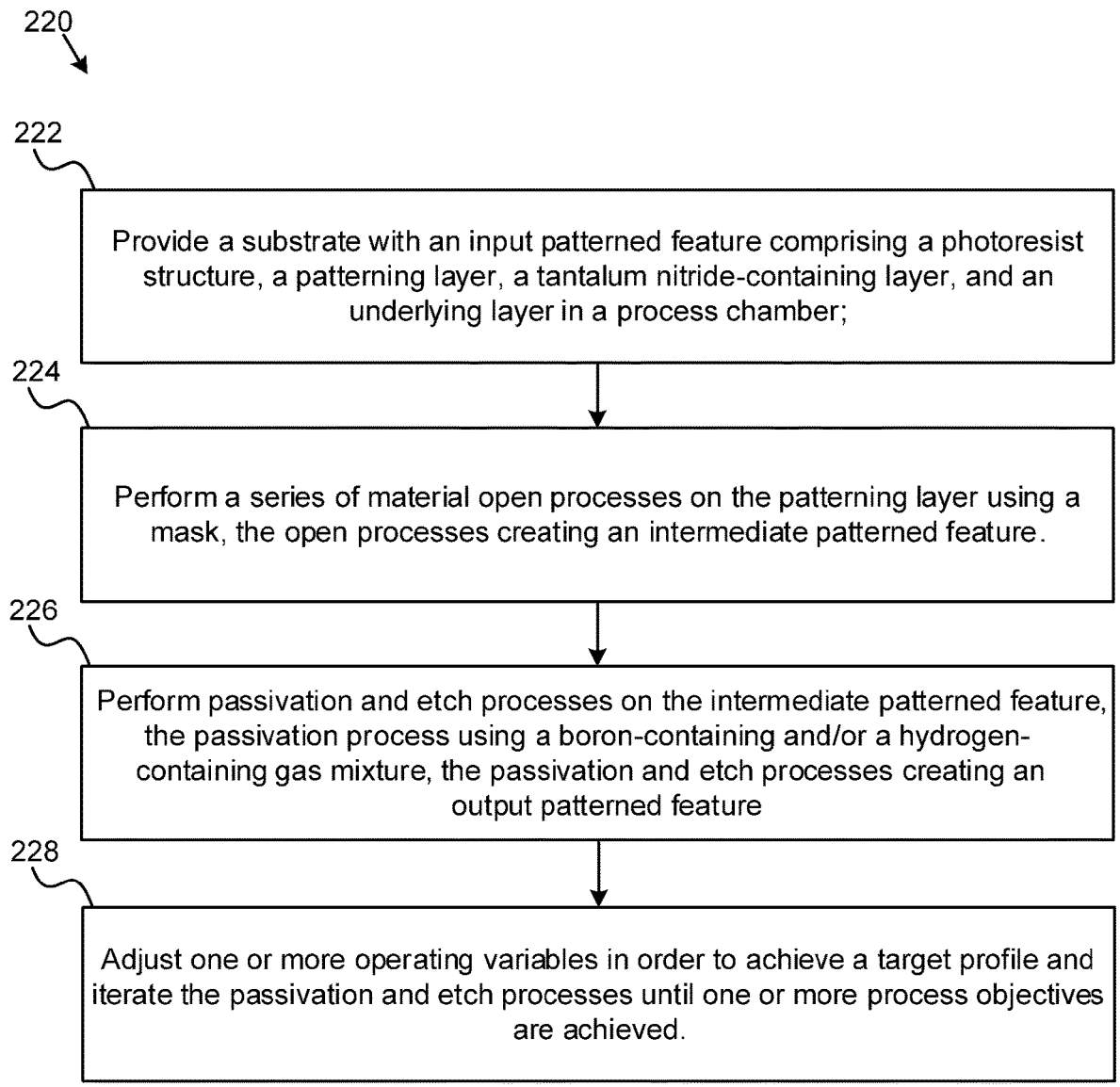
FIG. 2B illustrates another embodiment of a method for patterning features in a TaN layer.

FIG. 2B illustrates another embodiment of a method 220 for patterning features in a TaN layer. In an embodiment, a substrate is provided with an input patterned feature comprising a photoresist structure, a patterning layer, a tantalum nitride-containing layer, and an underlying layer in a process chamber at block 222. A series of material open processes is performed on the patterning layer using a mask, the open processes creating an intermediate patterned feature at block 224. A passivation process and an etch process are performed on the intermediate patterned feature, the passivation process using a boron-containing and/or a hydrogen-containing gas mixture at block 226. One or more operating variables are adjusted and the passivation and etch processes are iterated until one or more process objectives are achieved at step 228. The patterning layer can include silicon containing anti-reflective coating, a carbon planarizing film, and a tetraethoxysilane film. The one or more operating variables can include a flow rate of the boron-containing gas, flowrate of the hydrogen-containing gas, a ratio of the flowrate of the boron-containing gas to the hydrogen-containing gas, flowrate of other gases including argon, SF6, a high frequency power, a low frequency power, a pressure in the process chamber, an electrostatic chuck temperature, and other operating variables in the material open processes. The one or more process objectives can include a target etch rate of the TaN, target profile of the patterned feature comprising a target base width, a target hip width, a target cap width, a target height, and/or a target total height of the output patterned feature.

Figure 3A:
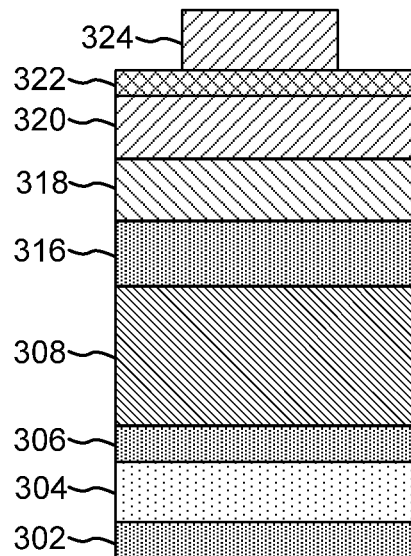
FIG. 3A is a cross-section diagram illustrating one embodiment of a workflow for processing a patterned workpiece.

FIGS. 3A-3E are cross-section diagrams illustrating a workpiece for forming a memory device or a BEOL interconnect pattern for logic devices on a substrate, such as wafer 125. In such an embodiment, the workpiece may include multiple layers. The multiple layers may be formed one on top of another in a stack configuration. In one such embodiment, the workpiece may include a first TaN layer 302, a copper (Cu) layer 304, a second TaN layer 306, a metal-containing stack 308 used in memory device or any other BEOL interconnect patterning for logic devices, a third TaN layer 316, a tetraethoxysilane (TEOS) layer 318, an organic planarizing (OPL) layer 320, an anti-reflective layer, such as a silicon antireflective coating (SiARC) layer 322, and a photoresist layer 324. The layer 308 can be a single or multi-layer metal stack containing metals like Cu, Co, Ge, Cr, Al, As, Ru, Ti, Te, etc. In an embodiment, the photoresist layer 324 may be patterned. In an embodiment, the plasma chamber 110 may receive a workpiece having the layered structure disposed thereon as shown in FIG. 3A. Although the described embodiment includes three separate TaN layers, one of ordinary skill will recognize that an actual workpiece may include greater or fewer numbers of TaN layers. Indeed, the number of TaN layers has no bearing on the operation of the present embodiments. One of ordinary skill will further recognize that the workpiece may include a variety of layers, including a greater or fewer number of layers different materials than those described herein. As long as at least one TaN layer is present, the described embodiments may be utilized.

Figure 3B:
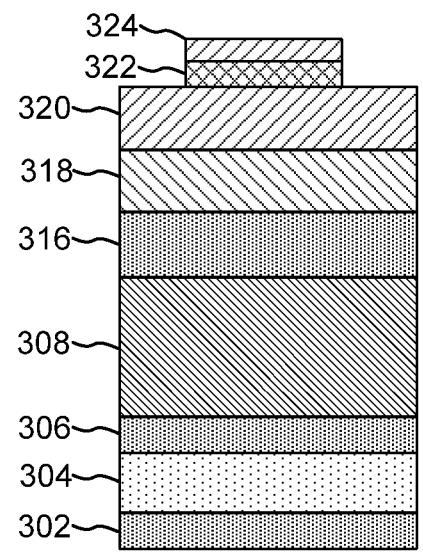
FIG. 3B is a cross-section diagram illustrating one embodiment of a workflow for processing a patterned workpiece.
Figure 3C:
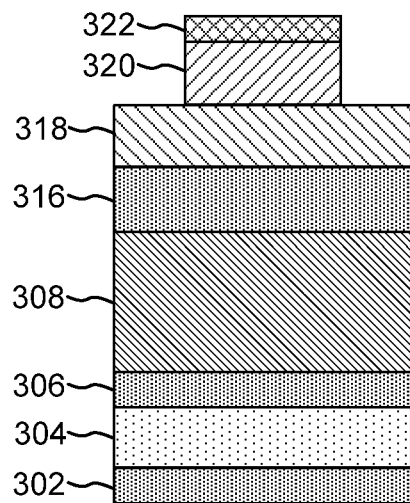
FIG. 3C is a cross-section diagram illustrating one embodiment of a workflow for processing a patterned workpiece.
Figure 3D:
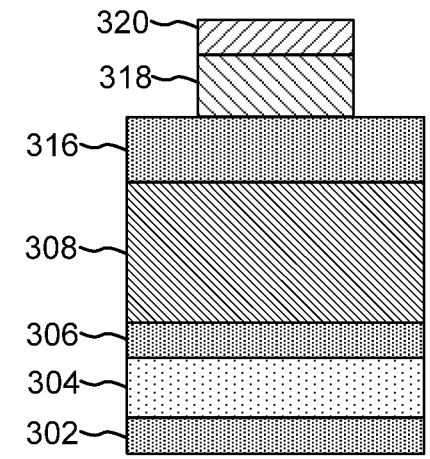
FIG. 3D is a cross-section diagram illustrating one embodiment of a workflow for processing a patterned workpiece.

In a series of etch processes as described in FIGS. 3B-3D several layers are opened to expose the third TaN layer 316 according to one or more known processes. In the process of FIG. 3B, the antireflective layer 322 may be etched in a pattern defined by the photoresist layer 324. The antireflective layer 322 may be removed using one of a plurality of sets of suitable processing parameters. For example, in one embodiment, the antireflective layer 322 etch process may be performed with a pressure in the range of 13 mT to 17 mT, a high frequency power in a range of 425 W to 575 W, a low frequency power in a range of 43 W to 58 W and at a temperature in a range of 30° C. to 52° C. In one such embodiment, a combination of $C_4F_8$ at a flow rate range of 3 sccm to 5 sccm, $CHF_3$ at a flow rate of 43 sccm to 58 sccm, and $CF_4$ at a flow rate of 68 sccm to 92 sccm may be used as an etch gas chemistry. One of ordinary skill will recognize alternative embodiments, including alternative gas combinations or processing parameter ranges that may be used depending upon the materials used for the antireflective layer 322.

In the process of FIG. 3C, the OPL layer 320 may be opened in a pattern defined by the SiARC layer 322. In the process of FIG. 3C, the TEOS layer 318 may be opened in a pattern defined by the OPL layer 320. The OPL layer 320 may be removed using one of a plurality of sets of suitable processing parameters. For example, in one embodiment, the OPL layer 320 etch process may be performed with a pressure in the range of 10 mT to 15 mT, a high frequency power in a range of 425 W to 575 W, a low frequency power in a range of 85 W to 115 W and at a temperature in a range of 30° C. to 52° C. In one such embodiment, a combination of HBr at a flow rate range of 77 sccm to 104 sccm, $CO_2$ at a flow rate of 68 sccm to 92 sccm, $O_2$ at a flow rate of 26 sccm to 35 sccm, and He at a flow rate of 170 sccm to 230 sccm may be used as an etch gas chemistry. One of ordinary skill will recognize alternative embodiments, including alternative gas combinations or processing parameter ranges that may be used depending upon the materials used for the OPL layer 320.

In the process of FIG. 3D, the TEOS layer 318 may be etched in a pattern defined by the OPL layer 320. The TEOS layer 318 may be removed using one of a plurality of sets of suitable processing parameters. For example, in one embodiment, the TEOS layer 318 etch process may be performed with a pressure in the range of 26 mT to 35 mT, a high frequency power in a range of 170 W to 230 W, a low frequency power in a range of 680 W to 920 W and at a temperature in a range of 43° C. to 69° C. In one such embodiment, a combination of Ar at a flow rate range of 765 sccm to 1035 sccm, $C_4F_8$ at a flow rate of 9 sccm to 19 sccm, $O_2$ at a flow rate of 4 sccm to 6 sccm, and $N_2$ at a flow rate of 85 sccm to 115 sccm may be used as an etch gas chemistry. One of ordinary skill will recognize alternative embodiments, including alternative gas combinations or processing parameter ranges that may be used depending upon the materials used for the TEOS layer 318.

Figure 3E:
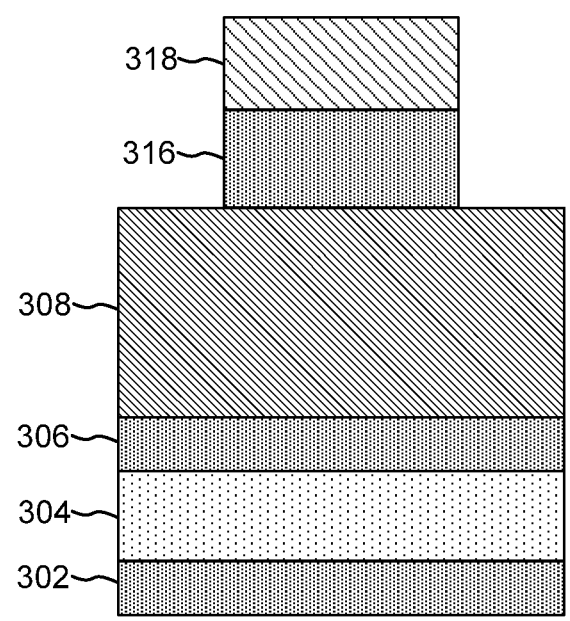
FIG. 3E is a cross-section diagram illustrating one embodiment of a workflow for processing a patterned workpiece.

In an embodiment, the third TaN layer 316 may be etched according to a process of FIG. 3E. In such an embodiment, the TaN layer 316 may be opened in a pattern defined by the TEOS layer 318. In an embodiment, the third TaN layer 316 etch process may be performed with a pressure in the range of 34 mT to 46 mT, a high frequency power in a range of 255 W to 345 W, a low frequency power in a range of 150 W to 200 W and at a temperature in a range of 38° C. to 52° C. In one such embodiment, a combination of Ar at a flow rate range of 170 sccm to 230 sccm, $SF_6$ at a flow rate of 43 sccm to 58 sccm, and $BCl_3$ at a flow rate of 10 sccm to 14 sccm may be used as an etch gas chemistry. One of ordinary skill will recognize alternative embodiments, including alternative gas combinations or processing parameter ranges that may be used depending upon the application or target processing objectives.

Although the present embodiments are described with reference to the processes performed on the third TaN layer 316, one of ordinary skill will recognize that the described processes are equally applicable to other layers of TaN, including the first TaN layer 302 and the second TaN layer 306. Indeed, the described embodiments may be useful in processing TaN in various structures or applications. Furthermore, equivalent processes may be used with substances other than TaN, where the materials exhibit similar etch profiles and respond similarly to additives in the etch gases.

Figure 4C:
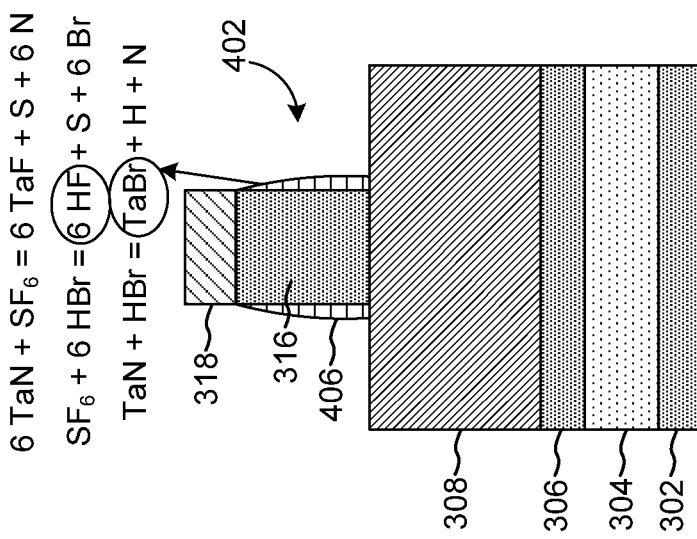
FIG. 4C is a cross-section diagram illustrating one embodiment of a workpiece with a patterned TaN layer.
Figure 4B:
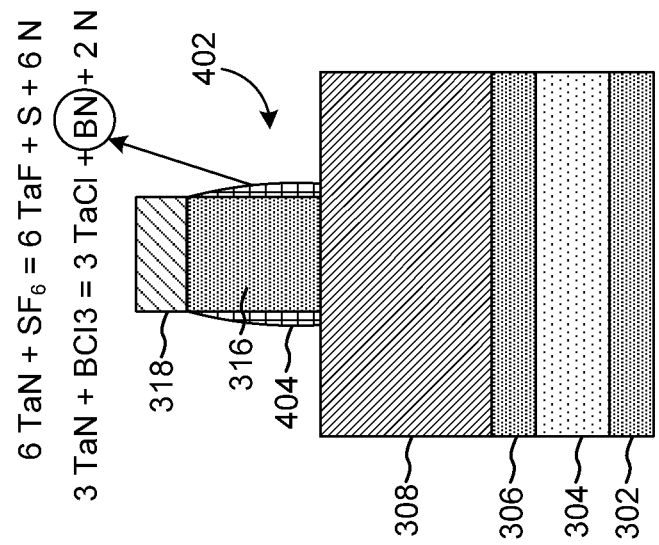
FIG. 4B is a cross-section diagram illustrating one embodiment of a workpiece with a patterned TaN layer.
Figure 4A:
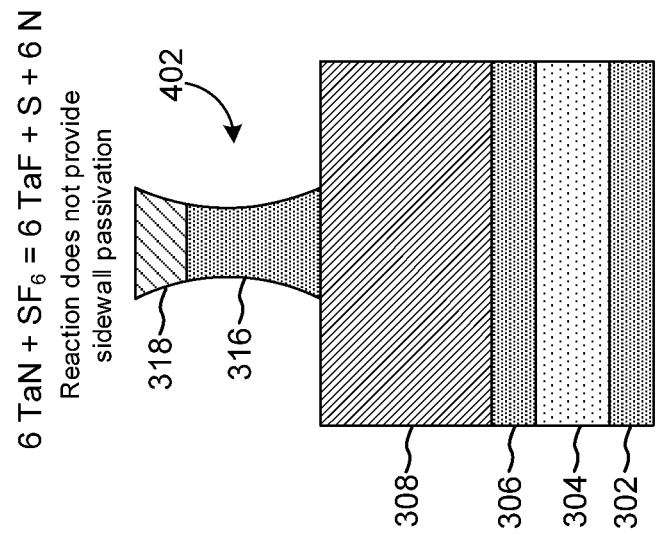
FIG. 4A is a cross-section diagram illustrating one embodiment of a workpiece with a patterned TaN layer.

FIG. 4A illustrates a baseline process for etching TaN materials, such as the third TaN layer 316 for formation of a patterned feature 402. In an embodiment, the patterned feature 402 may include a patterned portion of the third TaN layer 316. In a further embodiment, the patterned feature 402 may include a portion of the TEOS layer 318. In the described embodiment, a plasma etch gas that includes $SF_6$ is used for etching the third TaN layer 316. In such an embodiment, the reaction of $SF_6$ and TaN does not provide sufficient sidewall passivation to prevent underetch of the third TaN layer 316 with respect to the TEOS layer 318. In such an embodiment, the TaN may be isotropically etched to an extent that patterning of the underlying layers, such as the-metal-containing stack 308 may be damaged or substantially degraded. Thus, the process of FIG. 4A may be insufficient for certain applications or may reduce overall product throughput.

The embodiment of FIG. 4B includes the addition of $BCl_3$ in the etch gas chemistry. In such an embodiment, the boron may react with the nitrogen in the TaN to produce a boron nitride (BN) passivation layer 404 on sidewalls of the TaN layer. The boron nitride (BN) may passivate the TaN layer, thereby reducing necking of the third TaN layer 316 by slowing etch of the third TaN layer 316 along the sidewalls.

The embodiment of FIG. 4C illustrates an alternative embodiment, where HBr gas is added to the plasma gas chemistry. In such an embodiment, Hydrogen (H) from the HBr may combine with Fluorine (F) from the $SF_6$ to reduce the F radicals in the plasma. Reducing the F radicals may reduce the etch rate of the sidewalls of the third TaN layer 316. Further, the Bromine (Br) from the HBr may combine with Tantalum (Ta) from the TaN to produce an Tantalum Bromide (TaBr) passivation layer 406 on the sidewalls of the third TaN layer 316.

Figure 5:
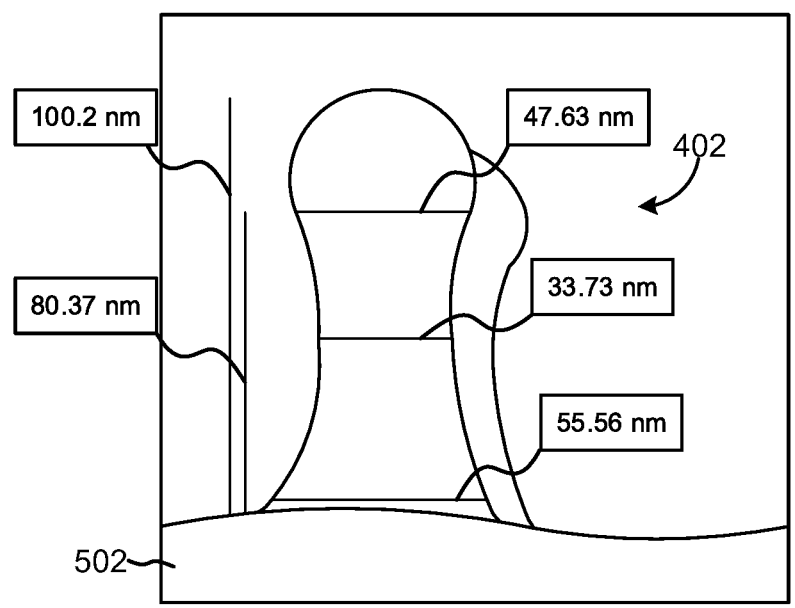
FIG. 5 is a dimensional diagram illustrating dimensions of a feature patterned in a TaN layer.

FIG. 5 is a dimensional diagram illustrating dimensions of a cross-section of one embodiment of the patterned feature 402 formed on a substrate 502 according to the baseline process described with relation to FIG. 4A. The substrate 502 is a metal-containing film similar to stack 308 in FIG. 4A. In an embodiment, the resulting patterned feature 402 has a base width of 45-65 nm, a neck width of 35-55 nm, and a cap width of 45-65 nm. The patterned feature 402 further included a TaN layer having a height of 80-100 nm and a total height of 100-120 nm.

In the embodiment of FIG. 5, the etch process may be performed with a pressure in the range of 34 mT to 46 mT, a high frequency power in a range of 255 W to 345 W, a low frequency power in a range of 150 W to 230 W and at a temperature in a range of 38° C. to 52° C. In one such embodiment, a combination of Ar at a flow rate range of 170 sccm to 230 sccm, and sulfur hexafluoride ($SF_6$) at a flow rate of 43 sccm to 58 sccm may be used as an etch gas chemistry.

By way of comparison, FIGS. 6A-6F illustrate cross-sections of patterned features 402 formed on substrates 502. In various embodiments, additional gases may be added to the etch chemistry at various flow rate ranges. For example, $BCl_3$, HBr, $CH_4$, $CHF_3$, or the like may be added to the etch chemistry.

Figure 6A:
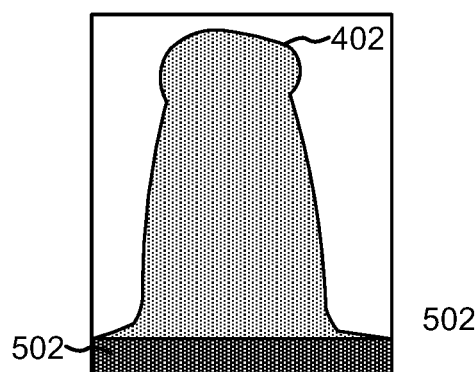
FIG. 6A is a cross-section diagram illustrating a profile of a feature patterned in a TaN layer according to one embodiment of a method for patterning features in a TaN layer.
Figure 6B:
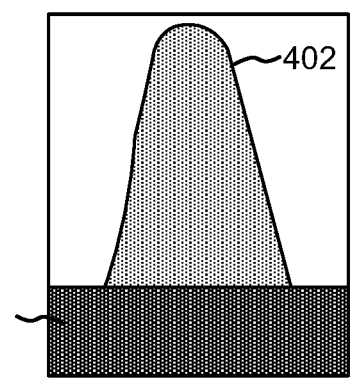
FIG. 6B is a cross-section diagram illustrating a profile of a feature patterned in a TaN layer according to one embodiment of a method for patterning features in a TaN layer.

FIG. 6A illustrates a result of forming the patterned feature 402 using a process that includes adding $BCl_3$ at a flow rate range of 10 sccm to 14 sccm to the etch chemistry for 85% of the etch process. The remaining 15% was performed without the additional $BCl_3$ to etch back the BN passivation layer 404. The result of FIG. 6B was produced with a process that included adding $BCl_3$ to the etch chemistry for the entire duration of the TaN etch. Both results show buildup of the BN passivation layer 404 on the TaN, and both results show improved cross-sectional dimensions of the third TaN layer 316 after patterning.

FIG. 6C shows the result of a process that includes adding HBr gas at a flow rate range of 10 sccm to 14 sccm to the etch chemistry for 85% of the etch process. The remaining 15% was performed without the additional HBr to etch back the TaBr passivation layer 406. The resulting patterned feature 402 had a base width of 45-65 nm, a neck width of 35-55 nm, and a cap width of 35-55 nm, with a TaN layer height of 80-100 nm and an overall feature height of 100-120 nm. This result show improvement over the baseline process without the buildup of as much sidewall passivation material as the embodiment of $BCl_3$. Embodiments where HBr is used have the additional benefit of not introducing additional Chlorine (Cl) into the plasma chamber 110, since Cl is known to be a corrosive agent.

Results of additional embodiments are illustrated in FIGS. 6D-6F. FIG. 6D illustrates an embodiment where fluoroform (CHF3) at a flow rate of 10 sccm to 14 sccm was added to the etch gas chemistry for 85% of the etch period. FIG. 6E illustrates a result of an embodiment where methane (CH4) was added to the etch gas chemistry for 85% of the etch period. Both embodiments showed significant control of the TaN sidewall passivation.

FIG. 6F shows a result of an embodiment of the baseline process, where the temperature at the substrate holder 120 was reduced from 40° C. to 20° C. during the etch process. Reduction of temperature shows further improvement of the TaN/TEOS selectivity, thus control of additional processing parameters, including temperature and pressure may be used for the passivation of the TaN sidewalls.

Figure 7A:
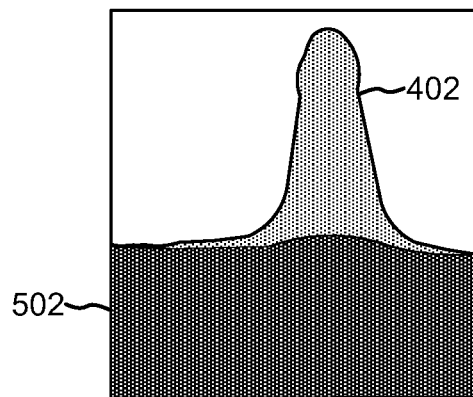
FIG. 7A is a cross-section diagram illustrating a profile of a feature patterned in a TaN layer according to one embodiment of a method for patterning features in a TaN layer.
Figure 7B:
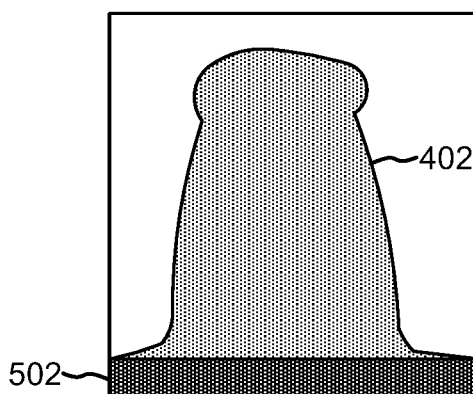
FIG. 7B is a cross-section diagram illustrating a profile of a feature patterned in a TaN layer according to one embodiment of a method for patterning features a TaN layer.
Figure 7C:
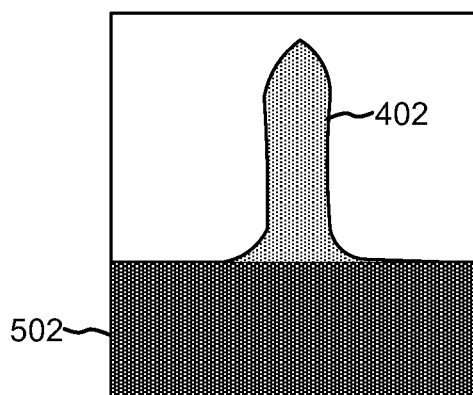
FIG. 7C is a cross-section diagram illustrating a profile of a feature patterned in a TaN layer according to one embodiment of a method for patterning features a TaN layer.

FIGS. 7A-7C illustrate cross-sections of experimental results of a method for patterning TaN. FIG. 7A illustrates a result of a method performed by adding 12 sccm of $BCl_3$ passivation gas to the plasma chemistry at 30° C. FIG. 7B illustrates a result of a method performed by adding 12 sccm of $BCl_3$ passivation gas to the plasma chemistry at 45° C. FIG. 7C illustrates a result of a method performed by adding 12 sccm of $BCl_3$ passivation gas to the plasma chemistry at 45° C. and at a pressure of 60 mT. While each result is better than the baseline process, it is clear from these results that controlling the temperature and pressure within the processing chamber 110 can control the results, such that target processing objectives are met. Examples of target processing objectives may include critical dimensions of the patterned feature 402, the amount of passivation layer buildup on the vertical walls of the third TaN layer 316, the size and shape of the TEOS cap, and the like.

Figure 8A:
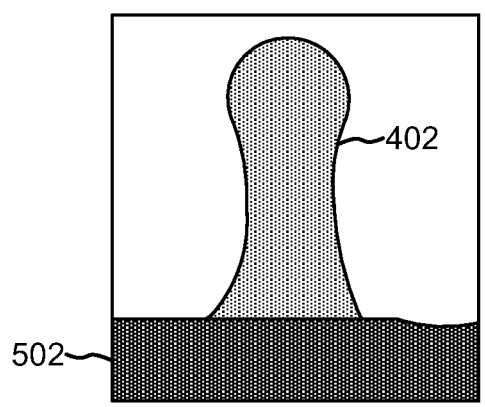
FIG. 8A is a cross-section diagram illustrating a profile of a feature patterned in a TaN layer according to one embodiment of a method for patterning features a TaN layer.
Figure 8B:
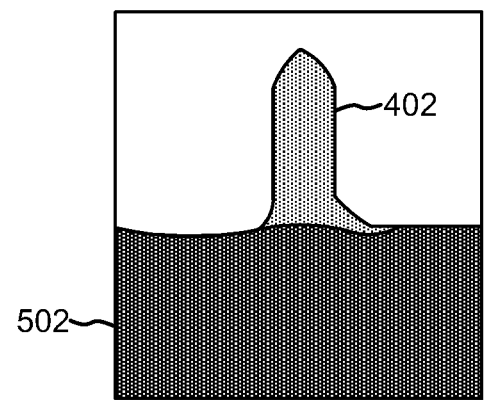
FIG. 8B is a cross-section diagram illustrating a profile of a feature patterned in a TaN layer according to one embodiment of a method for patterning features a TaN layer.

FIGS. 8A-8B illustrate cross-sections of experimental results of a method for patterning TaN performed with HBr added as a passivation gas to the etch chemistry. FIG. 8A illustrates a result of combining 50 sccm of $SF_6$ with 12 Sccm of HBr at 45° C. and a pressure of 40 mT. FIG. 8B illustrates a result of combining 50 sccm of $SF_6$ with 24 sccm of HBr at 45° C. and a pressure of 40 mT. As illustrated, varying the concentration of the passivation gas in the etch chemistry may also modulate the result. Thus, the concentration of gas may be controlled to meet one or more target processing objectives as well.

While specific processing parameters have been described herein to enable the embodiments of recipes that may be used to generate results similar to those shown in FIGS. 6A-8B, one of ordinary skill will recognize that the described parameters may be controlled within ranges to achieve target processing objectives. For example, flow rates of the passivation gas may be within a range of 1-50 sccm, or 12-24 sccm. Indeed, greater flow rates may be used in some embodiments, depending upon device and system requirements. Additionally, operating pressures may be within a range of 1-100 mT or 34 to 60 mT. Higher pressures may also be used in some embodiments, depending upon device and system requirements. Similarly, temperatures may be controlled within a range of 30-60 degrees Celsius. One of ordinary skill will recognize that higher or lower temperatures, for example within the range of 1-100 degrees Celsius, may be used, depending upon device and system requirements. Indeed, a wide variety of temperatures may be used, depending upon device and system requirements.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method for treating a substrate, comprising:
   receiving a substrate comprising a tantalum nitride (TaN) layer;
   etching the substrate to expose at least a portion of the TaN layer;
   performing a passivation process to reduce lateral etching of the TaN layer; and
   etching the TaN layer to form a feature therein;
   wherein the passivation process is controlled to meet one or more target passivation objectives,
   wherein the passivation process and etching the TaN layer process are iterated to meet passivation objectives, and
   wherein performing the passivation process further comprises reducing fluorine (F) radicals in a plasma formed from sulfur hexafluoride ($SF_6$) gas used for etching the TaN layer, and adding hydrogen bromide (HBr) to the $SF_6$ gas, the hydrogen from the HBr reducing a number of F radicals in the $SF_6$ plasma.

2. The method of claim 1, wherein the performing the passivation process is performed concurrently with etching the TaN layer.

3. The method of claim 1, wherein controlling the passivation process further comprises controlling a flow rate of the passivation gas.

4. The method of claim 3, wherein the flow rate of the passivation gas is in a range of 1-50 sccm or a range of 12-24 sccm.

5. The method of claim 1, wherein controlling the passivation process further comprises controlling a pressure within a processing chamber.

6. The method of claim 5, wherein the pressure is in a range of 1-100 mT or in a range of 34-60 mT.

7. The method of claim 1, wherein controlling the passivation process further comprises controlling a temperature within a processing chamber.

8. The method of claim 7, wherein the temperature is in a range of 30-60 degrees Celsius.

9. A method for treating a substrate, comprising:
   receiving a substrate comprising a tantalum nitride (TaN) layer;
   etching the substrate to expose at least a portion of the TaN layer;
   performing a passivation process with a passivation gas comprising hydrogen bromide (HBr) to reduce lateral etching of the TaN layer and reducing fluorine (F) radicals in a plasma formed from sulfur hexafluoride ($SF_6$) gas used for etching the TaN layer, wherein the hydrogen from the HBr reduces a number of the fluorine (F) radicals in the plasma formed from the $SF_6$ gas; and
   etching the TaN layer with the sulfur hexafluoride ($SF_6$) gas to form a feature therein,
   wherein the passivation process is controlled to meet one or more target passivation objectives.

10. The method of claim 9, wherein the performing the passivation process is performed concurrently with etching the TaN layer.

11. The method of claim 9, wherein controlling the passivation process further comprises controlling a flow rate of the passivation gas.

12. The method of claim 11, wherein the flow rate of the passivation gas is in a range of 1-50 sccm or a range of 12-24 sccm.

13. The method of claim 9, wherein controlling the passivation process further comprises controlling a pressure within a processing chamber.

14. The method of claim 13, wherein the pressure is in a range of 1-100 mT or in a range of 34-60 mT.

15. The method of claim 9, wherein controlling the passivation process further comprises controlling a temperature within a processing chamber.

16. The method of claim 15, wherein the temperature is in a range of 30-60 degrees Celsius.

* * * * *